United States Patent
Graef et al.

(10) Patent No.: US 7,702,989 B2
(45) Date of Patent: Apr. 20, 2010

(54) SYSTEMS AND METHODS FOR GENERATING ERASURE FLAGS

(75) Inventors: Nils Graef, Santa Clara, CA (US); Erich F. Haratsch, Bethlehem, PA (US)

(73) Assignee: Agere Systems Inc., Allentown, PA (US)

( * ) Notice: Subject to any disclaimer, the term of this patent is extended or adjusted under 35 U.S.C. 154(b) by 739 days.

(21) Appl. No.: 11/535,540

(22) Filed: Sep. 27, 2006

(65) Prior Publication Data

US 2008/0077829 A1    Mar. 27, 2008

(51) Int. Cl.
*H03M 13/00* (2006.01)
*G06F 11/00* (2006.01)
*G11C 29/00* (2006.01)

(52) U.S. Cl. .................. 714/780; 714/704; 714/774; 714/718

(58) Field of Classification Search ................. 714/704, 714/718, 774, 780
See application file for complete search history.

(56) References Cited

U.S. PATENT DOCUMENTS

| | | | | |
|---|---|---|---|---|
| 5,278,846 A | * | 1/1994 | Okayama et al. ............ | 714/755 |
| 5,701,314 A | * | 12/1997 | Armstrong et al. .......... | 714/765 |
| 5,978,414 A | * | 11/1999 | Nara ........................... | 375/225 |
| 6,438,717 B1 | * | 8/2002 | Butler et al. ................ | 714/704 |
| 6,671,404 B1 | * | 12/2003 | Kawatani et al. ............ | 382/190 |
| 6,788,654 B1 | * | 9/2004 | Hashimoto et al. .......... | 370/321 |
| 2006/0195772 A1 | * | 8/2006 | Graef et al. ................. | 714/795 |
| 2006/0248435 A1 | * | 11/2006 | Haratsch ..................... | 714/784 |
| 2008/0168330 A1 | * | 7/2008 | Graef et al. ................. | 714/765 |

* cited by examiner

*Primary Examiner*—John J Tabone, Jr.
(74) *Attorney, Agent, or Firm*—Hamilton, DeSanctis & Cha

(57) ABSTRACT

Various systems and methods for generating error indications are disclosed herein. In some cases, the error indication is used as an erasure pointer in a memory access system. As one particular example, a system for generating an erasure pointer is disclosed that includes accumulating a number of error values into an overall error value, and comparing the overall error value to an error threshold. When the overall error value exceeds the error threshold, an erasure pointer is generated. In one particular case, the error values are derived from a look up table using thermometer codes generated by an analog to digital converter. In other cases, the error values are derived from comparing a soft output with a reliability threshold.

16 Claims, 6 Drawing Sheets

SYSTEMS AND METHODS FOR GENERATING ERASURE FLAGS

BACKGROUND OF THE INVENTION

The present invention is related to systems and methods for accessing a storage medium, and more particularly to systems and methods for generating erasure flags in relation to storage media access.

When accessing information from a storage medium various errors can occur. To compensate, one or more encoding/decoding schemes are utilized that allow for error correction of the information accessed from the storage medium. For example, various hard disk drives utilize a Reed Solomon decoder to detect and correct errors in a received data stream. However, where too many errors exist in the data stream a Reed Solomon decoder may not come to a conclusion. To avoid this, one or more systems may indicate an overabundance of errors by setting an erasure flag. Such erasure flags have historically been generated based on criteria such as thermal asperity events and modulation-code violations. Such criteria offer some utility, but do not offer a desirable level of coding gain.

Hence, for at least the aforementioned reasons, there exists a need in the art for advanced systems and methods for generating error indications.

BRIEF SUMMARY OF THE INVENTION

The present invention is related to systems and methods for accessing a storage medium, and more particularly to systems and methods for generating erasure flags in relation to storage media access.

Various systems and methods for generating error indications are disclosed herein. In some cases, the error indication is used as an erasure pointer in a memory access system. As one particular example, a system for generating an erasure pointer is disclosed that includes accumulating a number of error values into an overall error value, and comparing the overall error value to an error threshold. When the overall error value exceeds the error threshold, an erasure pointer is generated. In one particular case, the error values are derived from a look up table using thermometer codes generated by an analog to digital converter. In other cases, the error values are derived from comparing a soft output with a reliability threshold.

Some embodiments of the present invention provide systems for generating error indications. The systems include an analog to digital converter that is operable to receive an analog signal and to produce a series of digital values based on the analog signal. The series of digital values are provided to an error look up table, and the error look up table in turn provides a corresponding series of error values. The system further includes an accumulator that is operable to accumulate the series of error values. A value programmed in an error threshold register is compared with the accumulated series of error values, and where the accumulated series of error values exceeds the error threshold in the error threshold register, an error condition is generated.

In some instances of the aforementioned embodiments, the systems include a latch that stores an indication of the error condition. In some such cases, the series of digital values provided by the analog to digital converter represent individual symbols and the latch is updated after each of the individual symbols is identified. In various of the aforementioned cases, the systems further include a sync detector capable of synchronizing to a data stream represented by the analog signal and of providing capability to identify the individual symbols.

In one particular case, the analog to digital converter is a six bit flash analog to digital converter, and the series of digital values corresponds to a thermometer code that includes both ideal output patterns and non-ideal output patterns. Where an ideal pattern is identified, a zero value is accumulated. In contrast, where a non-ideal pattern is identified, a non-zero value is accumulated.

Other embodiments of the present invention provide methods for generating erasure pointers. The methods include converting an analog signal to a series of digital values representative of the analog signal, and using a look up table to convert the series of digital values to a series of error values each corresponding to respective ones of the series of digital values. The series of error values are summed to create a cumulative error value that is then compared with an error threshold. Where the cumulative error value exceeds the error threshold, an error indication is generated. In some cases, the method further includes storing the error indication. In some such cases, the series of digital values are associated with bits of a series of symbols, and the error indication is stored or otherwise updated after each of the series of bits associated with a symbol have been identified.

Yet other embodiments of the present invention provide systems for generating error indications. The systems include a soft output decoder that is operable to receive a data stream and to produce a series of reliability indicators based on the data stream. In addition, the systems include a reliability threshold register that provides a reliability threshold output, and a comparator that compares the reliability threshold output with each of the respective reliability indicators. The comparator provides a non-zero value each time one of the reliability indicators exceeds the reliability threshold output. The system also includes an accumulator that sums the non-zero values. In some cases, the soft output decoder is a soft output viterbi algorithm decoder that provides a bit decision in relation to each of the respective reliability indicators.

The aforementioned systems may further include another comparator that is operable to compare the output of the accumulator (i.e., an accumulated error output) with an error threshold programmed into an error threshold register. When the accumulated error output exceeds the error threshold, an error condition is indicated. In some cases, the system further includes a latch that stores the indication of the error condition. In such cases, the series of reliability indicators may be associated with bits of a series of symbols, and the latch is updated after each of the series of symbols is identified. In various of such cases, the system further includes a sync detector that is used in part to identify the series of symbols.

Yet further embodiments of the present invention provide methods for generating erasure pointers based on soft information. Such methods include providing a data stream to a soft output decoder that is operable to produce a series of reliability indicators based on the data stream, comparing each of the series of reliability indicators with a reliability threshold, and incrementing an error value each time one of the series of reliability indicators exceeds the reliability threshold. In some cases, the aforementioned methods further include comparing the error value with an error threshold, and generating an error indication where the error value exceeds the error threshold. In various cases, the aforementioned methods further include setting the reliability threshold and the error threshold. Yet further, the error indication may be stored and restored each time a symbol is identified in the received data stream.

This summary provides only a general outline of some embodiments according to the present invention. Many other objects, features, advantages and other embodiments of the present invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several drawings to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

Figure 1:
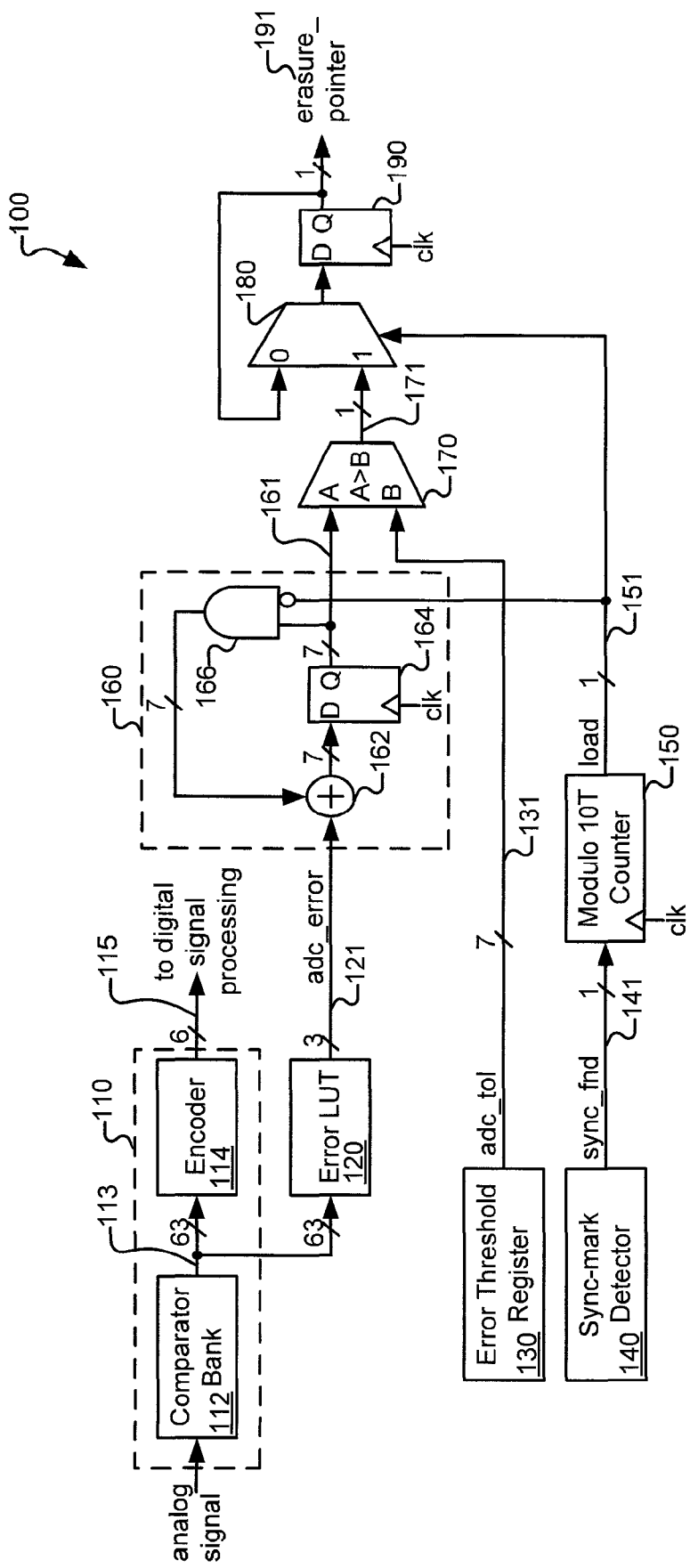
FIG. 1 is a schematic diagram of a circuit for generating erasure pointers based on analog to digital conversion error detection in accordance with one or more embodiments of the present invention.

The present invention is related to systems and methods for accessing a storage medium, and more particularly to systems and methods for generating erasure flags in relation to storage media access.

Various systems and methods for generating erasure pointers are described in this application. In particular, some embodiments of the present invention provide systems for generating erasure pointers. These systems include an analog to digital converter that is operable to receive an analog signal and to produce a series of digital values based on the analog signal. The series of digital values are provided to an error look up table, and the error look up table in turn provides a corresponding series of error values. As used herein, the phrase "look up table" is used in its broadest sense to mean any device capable of receiving an input value and providing an output that corresponds to the input value. Thus, for example, an error look up table may be a random access memory. In such a case, the random access memory may be programmed such that the input value operates to address the random access memory, and the addressed locations in the memory are written with the data corresponding to the input value. Other approaches may utilize software to perform a similar look up function. Based on the disclosure provided herein, one of ordinary skill in the art will recognize a variety of other approaches that may be used to implement a look up table. The aforementioned systems further include an accumulator that is operable to accumulate the series of error values. As used herein, the term "accumulator" is used in its broadest sense to mean any device, circuit or software that is used to accumulate incoming data. Thus, as just some of many examples an accumulator may be a counter that increments by one or another increment value each time an error is indicated. Alternatively, an accumulator may be an adder with a hold register that continually adds newly received values to an existing value. Such accumulators may be implemented in either or both of hardware and software. Based on the disclosure provided herein, one of ordinary skill in the art will recognize a number of accumulators that may be used in relation to one or more embodiments of the present invention. The systems further include a comparator that compares a value accumulated with a threshold value maintained in a register. As used herein, the terms "register", "latch" and "memory" are all used in their broadest sense to mean any device or functional block that is capable of receiving an input and storing the input for a prescribed period. Where the accumulated value exceeds the threshold value, an error condition is generated. In some cases, this error condition is an erasure pointer.

Other embodiments of the present invention provide other systems for generating error indications. These other systems include a soft output decoder that is operable to receive a data stream and to produce a series of reliability indicators based on the data stream. In some cases, such soft output decoders may be, but are not limited to, soft output viterbi algorithm decoders. As used herein, the phrase "reliability indicators" is used in its broadest sense to mean any information indicating the reliability of a decision or incoming data stream. Thus, for example, a reliability indicator may indicate a probability that a bit decoded from an incoming data stream was properly decoded. The systems may include a comparator that compares each of the series of reliability indicators with a reliability threshold. The output of the comparator is provided to an accumulator that sums the results of the series of comparisons. The aforementioned systems may further include another comparator that is operable to compare the output of the accumulator (i.e., an accumulated error output) with an error threshold programmed into an error threshold register. When the accumulated error output exceeds the error threshold, an error condition is indicated. In some cases, the system further includes a latch that stores the indication of the error condition. In such cases, the series of reliability indicators may be associated with bits of a symbol, and the latch is updated after each series of bits that corresponds to one symbol. In various of such cases, the system further includes a sync detector that is used in part to identify the series of symbols. As used herein, the phrase "symbol" is used in its broadest sense to mean a logically grouped set of data. Thus, for example, a symbol may be a series of consecutive bits in a data stream. As a more particular example, a symbol may include, but is not limited to, a series of ten consecutive bits. Based on the disclosure provided herein, one of ordinary skill in the art will recognize a myriad of symbols that may be used and/or processed using one or more embodiments of the present invention.

Turning to FIG. 1, an erasure pointer generating circuit 100 is depicted. Erasure pointer generating circuit 100 includes an analog to digital converter 110 that is comprised of a comparator bank 112 and an encoder 114. An output 113 of comparator bank 112 provides a series of digital values that are fed to both encoder 114 and an error look up table 120. In turn, encoder 114 encodes the series of digital values as an output 115. Output 115 is provided to one or more digital signal processing circuits (not shown). For example, erasure pointer generating circuit 100 may be included as part of a decoder included in a hard disk drive system. In such a case, output 115 may be provided to one or more soft output viterbi algorithm decoders and/or Reed Solomon decoders that operate to recover data from an analog data stream retrieved from the magnetic storage media of the hard disk drive.

Under perfect conditions, comparator bank 112 generates an error free output pattern as output 113. In one particular case, comparator bank 112 provides a thermometer code output. As used herein, the phrases thermometer code is used in its broadest sense to mean a code whereby each incrementally larger code value is indicated by setting or unsetting the next bit in the output symbol. Thus, for example, the following series of outputs may be provided as an exemplary four bit thermometer code: '0000', '1000', '1100', '1110', '1111'. In the preceding example, the code '0000' may represent the lowest possible received analog value, and the code '1111' may represent the highest received analog value. The intervening codes represent the resolution between the high and low values. In the depicted circuit, comparator bank 112 includes sixty-three comparators capable of generating the corresponding sixty-four expected or ideal symbols.

In high-speed applications, some comparators within comparator bank 112 may generate a false response, showing some "bubbles" in the thermometer code pattern (known under this name because of the analogy with the bubbles appearing in a mercury thermometer). A thermometer code that does not exhibit bubbles is known as an ideal output pattern or expected code, while a thermometer code that exhibits a bubble is known as a non-ideal output pattern or unexpected code. As used herein, the phrase "ideal output pattern" is used in it broadest sense to mean any pattern that is expected, and the phrase "non-ideal output pattern" is used in its broadest sense to mean any unexpected output pattern. Thus, the previously provided four bit thermometer code was described by a progressively increasing series of ideal output patterns. Other non-ideal output patterns may, however, be generated by comparator bank where an error or other spurious behavior of analog to digital converter 110 occurs. These other non-ideal output patterns for the four bit example include: 0001, 0010, 0011, 0100, 0101, 0110, 0111, 1001, 1010, 1011, 1101. Each of these codes represent some error condition with some of the codes representing a more significant error condition than others. Encoder 114 may be designed to correct these non-ideal output patterns by mapping each non-ideal pattern onto the "closest" ideal pattern. However, the logic can not always reliably correct all errors, resulting in large noise at the ADC output. Thus, for example, non-ideal pattern 0101 could be mapped onto 1100 or 1111 or 0000. In this example, the uncertainty ranges across the entire exemplary four bit ADC range. In some embodiments of the present invention, such an error condition is avoided by setting an erasure pointer that causes the data corresponding to the non-ideal pattern to be rejected where too many errors are detected.

As mentioned output 113 is also provided to error look up table 120. Error look up table 120 converts the series of values received as output 113 to a series of pre-programmed error values provided as an output 121. In one particular case, an ideal or expected symbol corresponds to a zero output values, where non-ideal or unexpected symbols correspond to non-zero output value. The magnitude of the non-zero output values can be programmed to reflect the severity of the perceived error associated with a given non-ideal symbol. The errors programmed into look up table 120 reflect the probability that encoder 114 can properly correct one or more bubbles. Thus, where a code represents an easily corrected error, a smaller value will be programmed into look up table 120 than for a code where the probability of accurate correction is lower. Table 1 below shows exemplary look up table values corresponding to input values. Of note, the ideal input values correspond to non-zero error values and the non-ideal input values correspond to non-zero error values. It should be noted that the values of Table 1 are merely exemplary and that based on the disclosure provided herein, one of ordinary skill in the art will recognize other values that may be programmed into look up tables depending upon the perceived severity of an error represented by a code and an ability for other circuitry to correct the perceived error.

TABLE 1

Exemplary Corresponding Error Values for a Four Bit Thermometer Code

| Output of comparator bank | The "closest" legal pattern(s), which is output of the encoder | Uncertainty of encoder output, defined as the difference in the corresponding output values of all possible "closest" legal patterns | Minimum number of bubbles | Exemplary output of Error LUT |
|---|---|---|---|---|
| 0000 | 0000 | 0 | 0 | 0 |
| 0001 | 0000 | 0 | 1 | 1 |
| 0010 | 0000 | 0 | 1 | 1 |
| 0011 | 0000, 1111 | 4 | 2 | 4 |
| 0100 | 0000, 1100 | 2 | 1 | 2 |
| 0101 | 0000, 1100, 1111 | 4 | 2 | 4 |
| 0110 | 1110 | 0 | 1 | 1 |
| 0111 | 1111 | 0 | 1 | 1 |
| 1000 | 1000 | 0 | 0 | 0 |
| 1001 | 1000 | 0 | 1 | 1 |
| 1010 | 1000, 1110 | 2 | 1 | 2 |
| 1011 | 1111 | 0 | 1 | 1 |
| 1100 | 1100 | 0 | 0 | 0 |
| 1101 | 1111 | 0 | 1 | 1 |
| 1110 | 1110 | 0 | 0 | 0 |
| 1111 | 1111 | 0 | 0 | 0 |

Using error look up table 120, an error value for each output pattern of output 112 is provided. The corresponding error values from look up table 120 are provided to an accumulator 160 as output 121. Each error value is added to the existing error value stored in a register 164 using an adder 162. Thus, as errors are received, the value maintained in register 164 increases. In one particular implementation, accumulator 160 is implemented with a seven bit register 164, an adder 162, and seven AND-gates with inverting input 166 to clear the accumulated value. A cumulative error value 161 from register 164 is provided to a comparator 170. Comparator 170 also receives an error threshold value 131 from an error threshold register 130. Where cumulative error value 161 from register 164 exceeds error threshold value 131, an output 171 of comparator 170 is asserted high. Otherwise, output 171 of comparator 170 is asserted low.

In addition, erasure pointer generating circuit 100 includes a sync mark detector 140 and a symbol counter 150. In operation, sync mark detector 140 monitors an incoming data stream and identifies synchronization data within the data stream. In some cases, sync mark detector 140 is a sync mark detector circuit that is commonly used in hard disk drive applications to identify synchronization data within wedges distributed around the platter of a hard disk drive. However, sync mark detector 140 may be any circuit capable of detecting an indication of a location within a data stream. Data is often arranged in a series of segments of known size that begin some point after a synchronization mark. These segments may be generally referred to as symbols, and symbol counter 150 is responsible for identifying individual symbols within an incoming data stream. In the depicted case, symbol counter 150 is a modulo 10T counter that is tailored for identifying a series of symbols within the data stream, where a symbol spans ten periods.

Each time a new symbol is indicated (i.e., each ten periods of the incoming data stream), an output 151 (i.e., load output) is asserted high. Output 151 is applied to the selection input of a multiplexer 180 causing multiplexer 180 to pass output 171 to the input of register 190. Register 190 is then clocked causing output 171 to be stored in register 190. The output of register 190 is an erasure pointer 191 that when asserted high indicates that the last received symbol is encumbered with too many error and should be specially treated. During processing of the next symbol, output 151 is asserted low causing the output of register 190 to be fed back into register 190 via multiplexer 180. In this way, the erasure pointer maintains its state for a symbol at a time.

In addition, when a new symbol is indicated through the assertion of output 151, a zero value is applied to adder 162 via a gate 166. In this way, the error value count is effectively reset after each symbol completes. This allows accumulator 160 to maintain an error count associated with data from each incoming symbol. As shown, all flip-flops or registers in erasure pointer generating circuit 100 are clocked by a signal "clk", whose period equals 1T.

Figure 2:
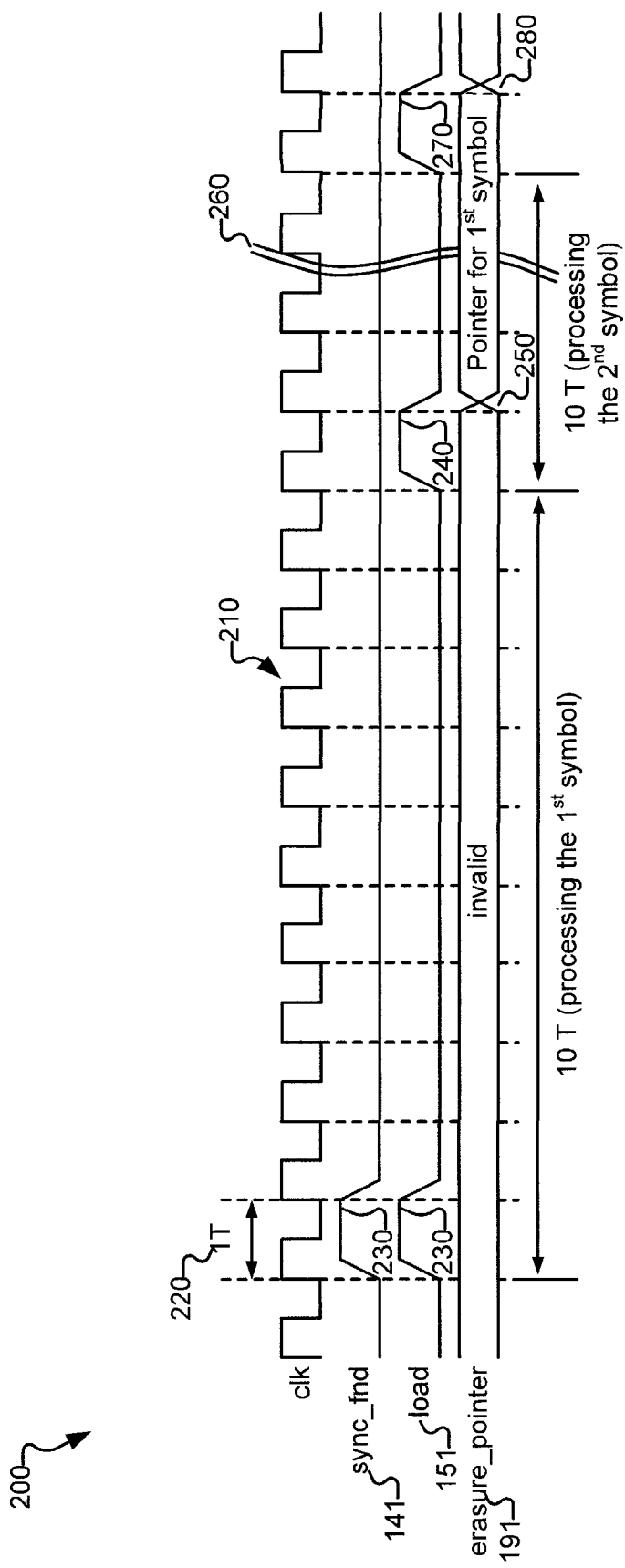
FIG. 2 is a timing diagram depicting an exemplary operation of the circuit in FIG. 1 in accordance with some embodiments of the present invention.

Turning to FIG. 2, a timing diagram 200 depicts an exemplary operation of the circuit in FIG. 1 in accordance with some embodiments of the present invention. The clk signal is shown as a series of pulses with a period (1T) 220. At some point 230 during the processing of the incoming data stream, a synchronization mark in the data stream is identified causing an output 141 (i.e., a sync found output) to assert high for one clock period. At the same time 230, output 151 asserts high for one clock period. This causes the accumulated error value to be stored to register 190, and for accumulator 160 to be reset. One symbol later in time 240, symbol counter 150 asserts output 151 high. This causes register 190 to update with the value from accumulator 160 which is shown as an update of erasure pointer 191 (point 250), and for accumulator 160 to reset. The process then repeats with output 151 being asserted high one symbol later (point 270). The time period between point 240 and point 270 is compressed as indicated by wavy lines 260. Upon assertion of output 151, register 190 is updated with the value from accumulator 160 which is shown as an update of erasure pointer 191 (point 280), and accumulator 160 is reset. This process continues until the next synchronization mark is identified at which time symbols are again counted from that synchronization mark. Erasure pointer 191 may be further delayed and aligned with the corresponding symbol-data that is transferred to a down stream error correction circuit (not shown in FIG. 1). The error correction circuit may use erasure pointer 191 to erase flagged symbols, which enables the error correction circuit to correct more symbols resulting in a better error rate performance of the hard disk drive system.

Figure 3:
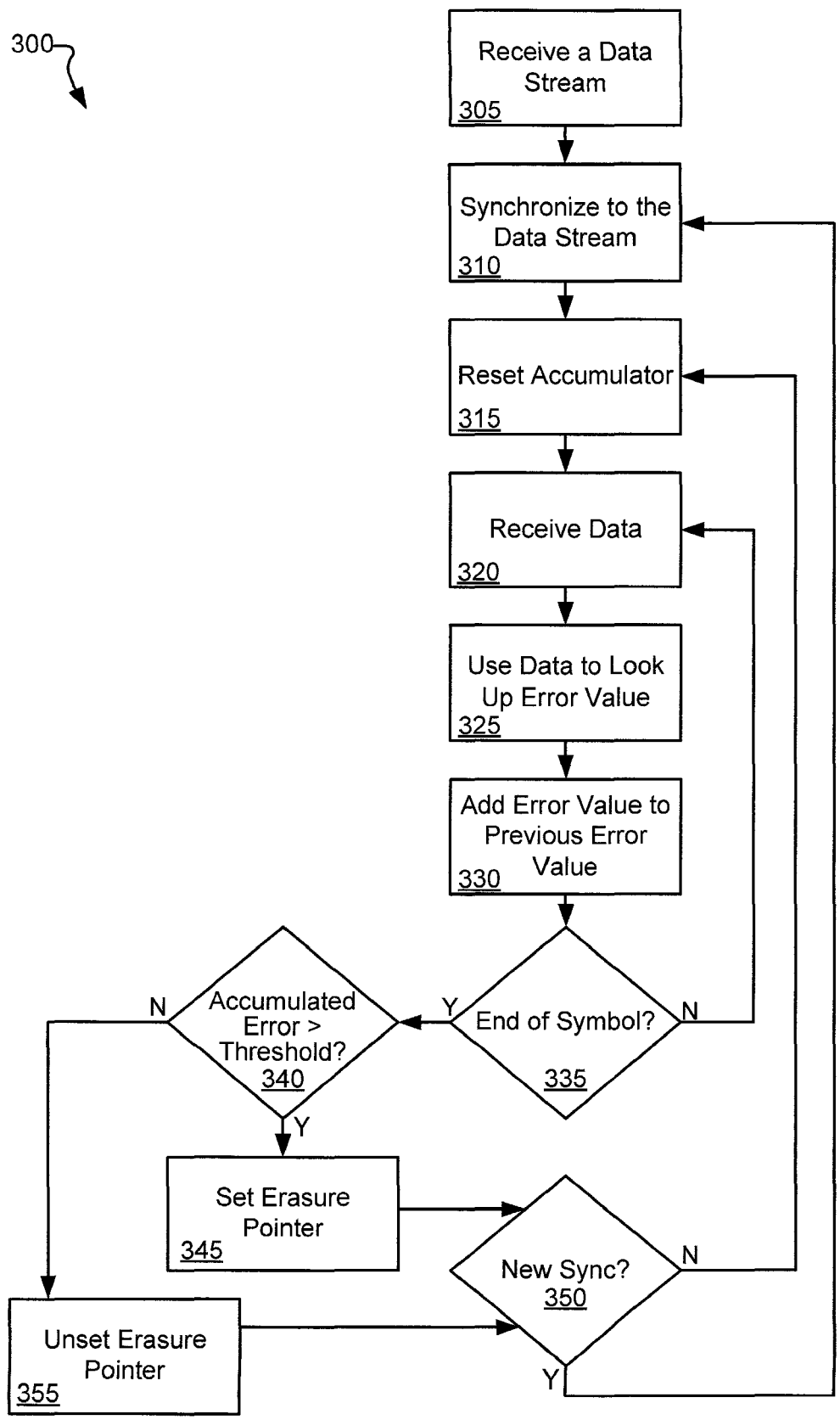
FIG. 3 is a flow diagram depicting a method for generating erasure pointers based on analog to digital conversion error detection in accordance with some embodiments of the present invention.

Turning to FIG. 3, a flow diagram 300 depicts a method for generating erasure pointers based on analog to digital conversion error detection in accordance with some embodiments of the present invention. Following flow diagram 300, a data stream is received as an analog signal and converted to a digital representation thereof (block 305). A synchronization mark is identified in the data stream and the process is synchronized using the synchronization mark (block 310), and the accumulator is reset (block 315). The digital data is received from the analog to digital converter (block 320) and the received data is used to access an error look up table (block 325). An error value corresponding to the received data is obtained from the error look up table, and the error value is added to a previously accumulated error value maintained in the accumulator (block 330). It is determined whether the end of a symbol has been reached (block 335). Where the end of a symbol has not yet been reached (block 335), the process continues by receiving and processing the next data (blocks 320-335).

Alternatively, where the end of the symbol has been achieved (block 335), it is determined whether the accumulated error value is greater than a predetermined error threshold (block 340). Where the error threshold is exceeded (block 340), the erasure pointer is set (block 345). Otherwise, the erasure pointer is unset (block 355). It is then determined whether another synchronization mark has been identified (block 350). Where another synchronization mark has been identified (block 350), the process is re-synchronized (block 310) and the processing continues for the next symbols (blocks 315-355). Otherwise, where another synchronization mark is not identified (block 350), the accumulator is reset (block 315) and the processing continues for the next symbol (blocks 320-355).

Figure 4:
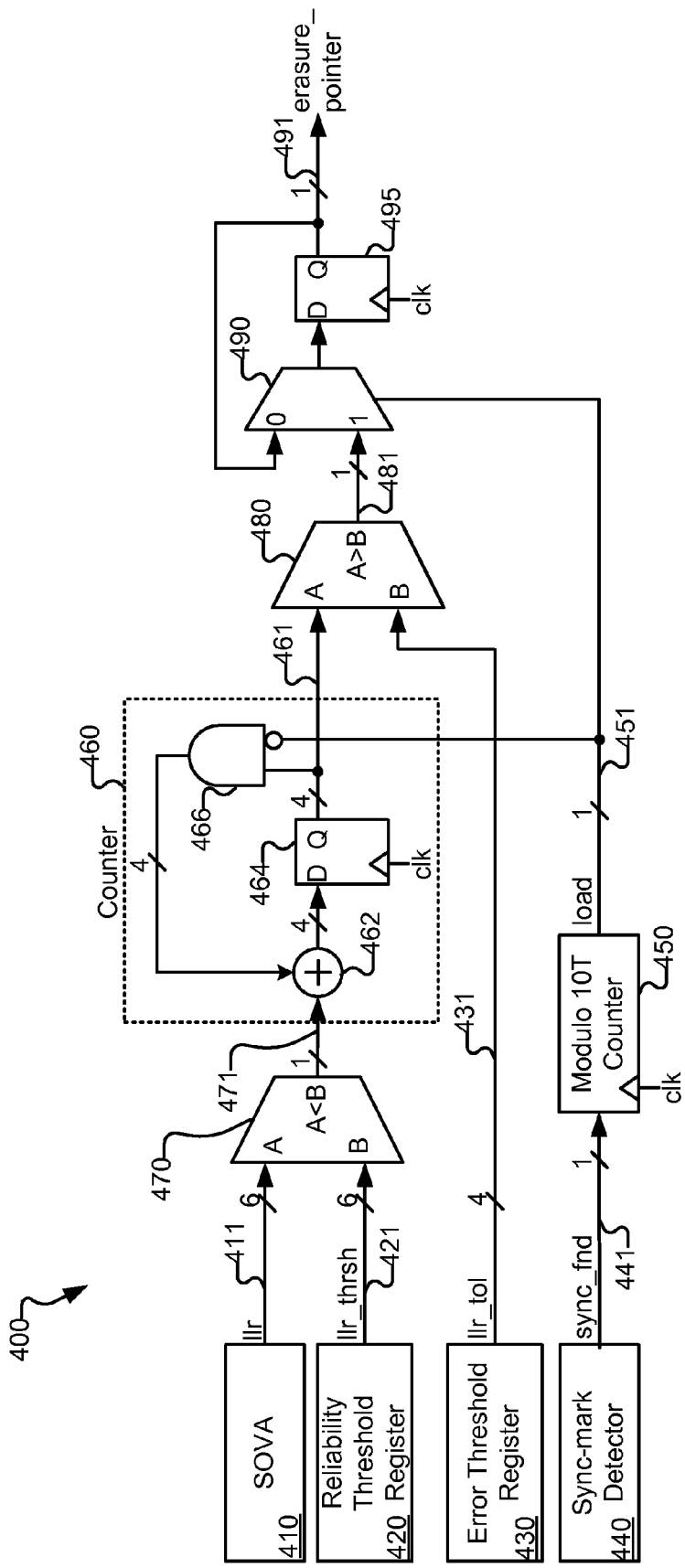
FIG. 4 is a schematic diagram of a circuit for generating erasure pointers based on soft inputs in accordance with one or more embodiments of the present invention.

Turning to FIG. 4, an erasure pointer generating circuit 400 based on soft inputs is depicted. Erasure pointer generating circuit 400 includes a soft output viterbi algorithm detector 410 that provides both bit decisions and associated reliability information (i.e., soft output) as is known in the art. As shown in FIG. 4, the reliability information may be a log likelihood ratio (llr). The reliability information is provided as an output 411 to a comparator 470. In addition, comparator 470 receives a reliability threshold output 421 that represents a value programmed into a threshold register 420. As shown in FIG. 4, the reliability threshold output may be a log likelihood ratio threshold (llr thrsh). An output 471 from comparator 470 is provided to a counter 460. It should be noted that counter 460 is a special type of an accumulator and that based on the disclosure provided herein, one of ordinary skill in the art will recognize other types of accumulators that may be used in accordance with one or more embodiments of the present invention. As shown, counter 460 includes a four bit register 464 that maintains the accumulated count value, an adder 462 and four AND-gates each with one inverted input 466. In operation, each time reliability output 411 is less than reliability threshold 421, comparator output 471 is asserted high and counter 460 is incremented. In contrast, each time reliability output 411 is greater than reliability threshold 421, comparator output 471 is asserted low and counter 460 is not incremented. Thus, an output value 461 of counter 460 provides a representation of the probability that a symbol has been properly construed.

Output value 461 (i.e., the accumulated error value) is provided to a comparator 480. Comparator 480 also receives an error threshold value 431 from an error threshold register 430. Where output value 461 from register 464 exceeds error threshold value 431, an output 481 of comparator 480 is asserted high. Otherwise, output 481 of comparator 480 is asserted low.

In addition, erasure pointer generating circuit 400 includes a sync mark detector 440 and a symbol counter 450. In operation, sync mark detector 440 monitors an incoming data stream and identifies synchronization data within the data stream. In some cases, sync mark detector 440 is a sync mark detector circuit that is commonly used in hard disk drive applications to identified synchronization data within wedges distributed around the platter of a hard disk drive. However, sync mark detector 440 may be any circuit capable of detecting an indication of a location within a data stream. Data is often arranged in a series of segments of known size that begin some point after a synchronization mark. These segments may be generally referred to as symbols, and symbol counter 450 is responsible for identifying individual symbols within an incoming data stream. In the depicted case, symbol counter 450 is a modulo 10T counter that is tailored for identifying a series of symbols within the data stream, where a symbol spans ten periods.

Each time a new symbol is indicated (i.e., each ten periods of the incoming data stream), an output 451 (i.e., load output) is asserted high. Output 451 is applied to the selection input of a multiplexer 490 causing multiplexer 490 to pass output 481 to the input of register 495. Register 495 is then clocked causing output 481 to be stored in register 495. The output of register 495 is an erasure pointer 491 that when asserted high indicates that the last received symbol is encumbered with too many error and should be specially treated. During processing of the next symbol, output 451 is asserted low causing the output of register 495 to be fed back into register 495 via multiplexer 490. In this way, the erasure pointer maintains its state for a symbol at a time.

In addition, when a new symbol is indicated through the assertion of output 451, a zero value is applied to adder 462 via AND gate 466. In this way, the error value count is effectively reset after each symbol completes. This allows counter 460 to maintain an error count associated with data from each incoming symbol. As shown, all flip-flops or registers in erasure pointer generating circuit 100 are clocked by a signal "clk", whose period equals 1T.

Figure 5:
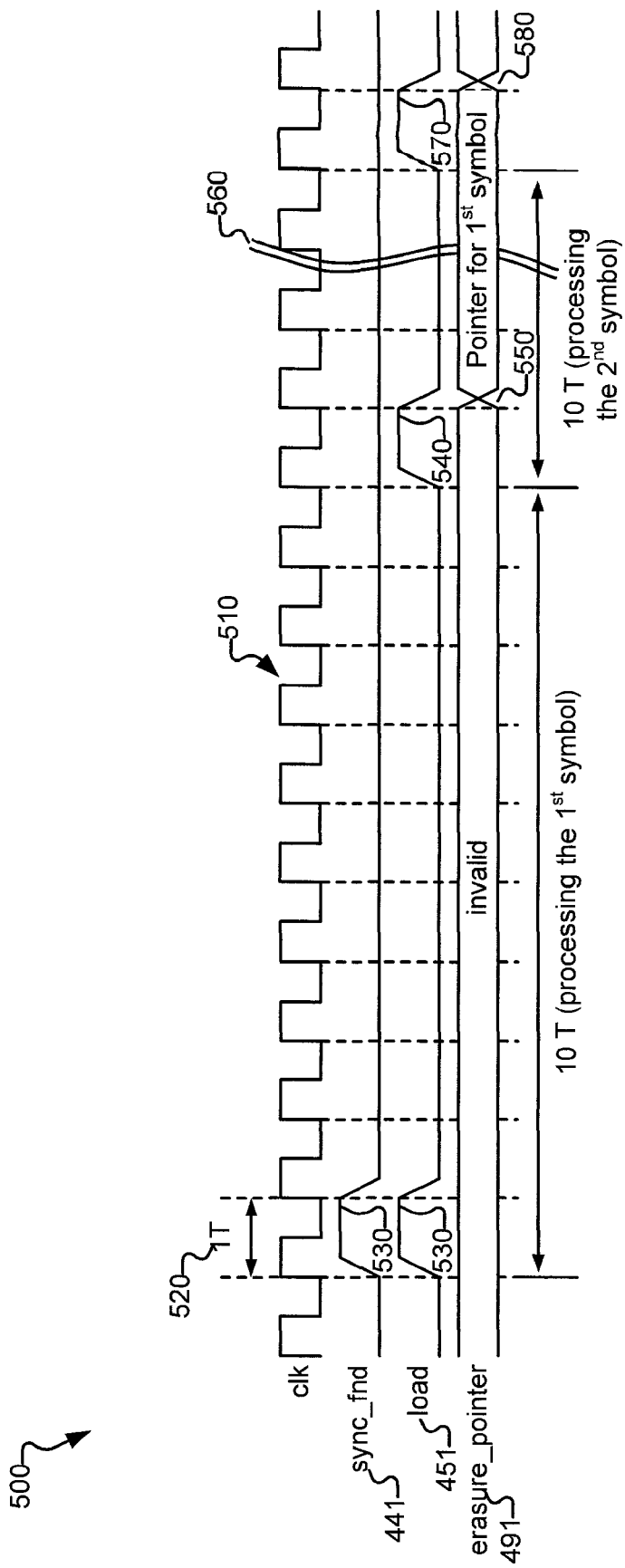
FIG. 5 is a timing diagram depicting an exemplary operation of the circuit in FIG. 4 in accordance with some embodiments of the present invention.

Turning to FIG. 5, a timing diagram 500 depicts an exemplary operation of the circuit in FIG. 4 in accordance with various embodiments of the present invention. The clk signal is shown as a series of pulses with a period (1T) 520. At some point 530 during the processing of the incoming data stream, a synchronization mark in the data stream is identified causing output 441 (i.e., a sync found output) to assert high for one clock period. At the same time 530, output 451 asserts high for one clock period. This causes the accumulated error value to be stored to register 495, and for counter 460 to be reset. One symbol later in time 540, symbol counter 550 asserts output 551 high. This causes register 495 to update with the value from counter 560 which is shown as an update of erasure pointer 491 (point 550), and for counter 560 to reset. The process then repeats with output 451 being asserted high one symbol later (point 570). The time period between point 540 and point 570 is compressed as indicated by wavy lines 560. Upon assertion of output 451, register 495 is updated with the value from counter 460 which is shown as an update of erasure pointer 491 (point 580), and counter 460 is reset. This process continues until the next synchronization mark is identified at which time symbols are again counted from that synchronization mark. Erasure pointer 491 may be further delayed and aligned with the corresponding symbol-data that is transferred to a down stream error correction circuit (not shown in FIG. 4). The error correction circuit may use erasure pointer 491 to erase flagged symbols, which enables the error correction circuit to correct more symbols resulting in a better error rate performance of the hard disk drive system.

Figure 6:
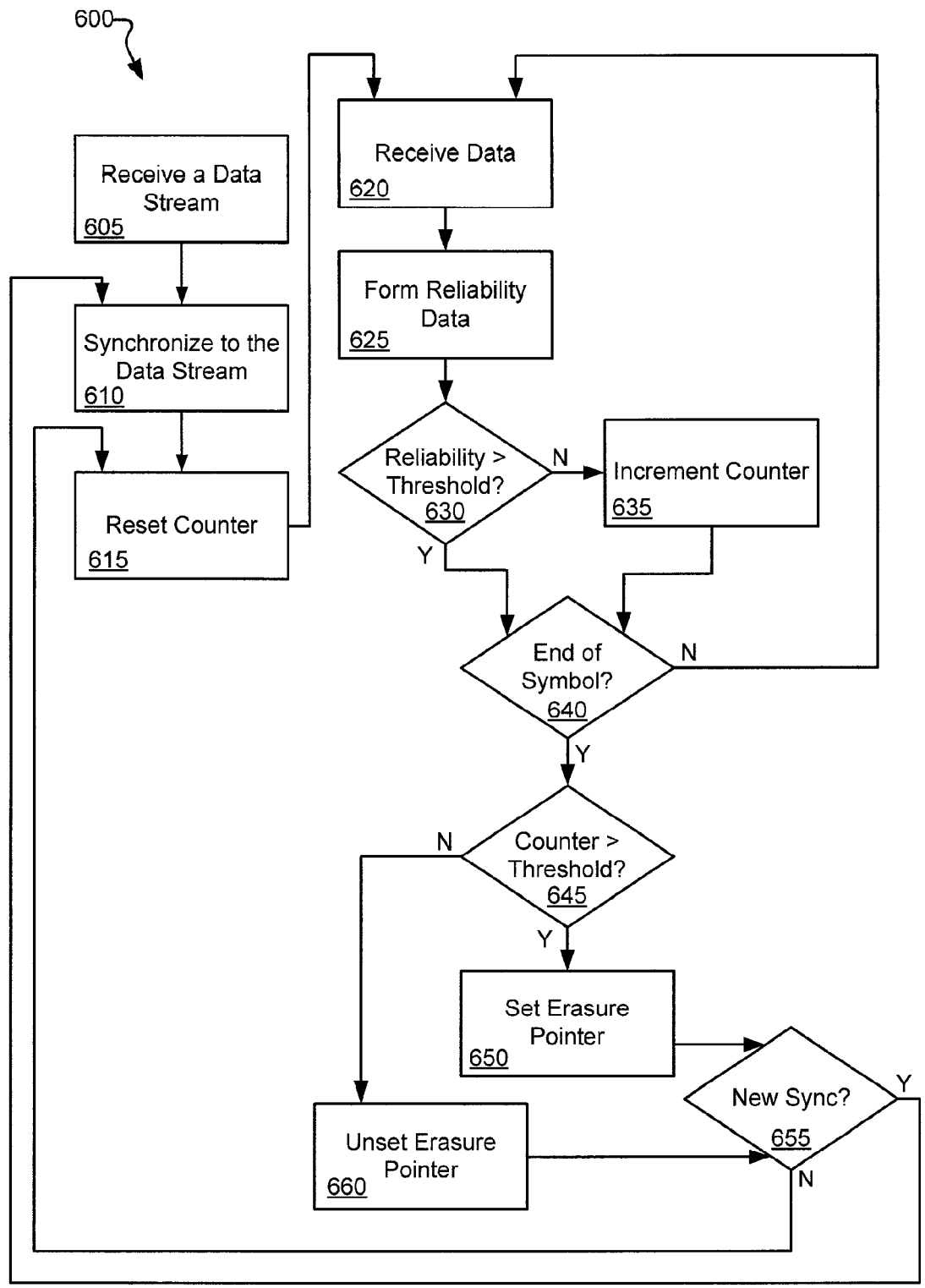
FIG. 6 is a flow diagram depicting a method for generating erasure pointers based on soft inputs in accordance with some embodiments of the present invention.

Turning to FIG. 6, a flow diagram 600 depicts a method for generating erasure pointers based on soft inputs in accordance with some embodiments of the present invention. Following flow diagram 600, a data stream is received (block 605). A synchronization mark is identified in the data stream and the process is synchronized using the synchronization mark (block 610), and a counter is reset (block 615). The data is received (block 620) at some point in the digital processing chain and reliability data associated with the data is produced (block 625). This reliability data is compared with a reliability threshold (block 630). Where the reliability data is less than the threshold (i.e., there is a substantial probability that the data is improperly construed) (block 630), then the counter is incremented (block 635). The counter indicates an error value, with the higher value on the counter indicating the greater probability of errors. Alternatively, where the reliability data is greater than the threshold (i.e., the data is most likely valid) (block 635), then the counter is not incremented.

It is determined whether the end of a symbol has been reached (block 640). Where the end of a symbol has not yet been reached (block 640), the process continues by receiving and processing the next data (blocks 620-640). Alternatively, where the end of the symbol has been achieved (block 640), it is determined whether the value on the counter exceeds a predetermined error threshold (block 645). Where the error threshold is exceeded (block 645), the erasure pointer is set (block 650). Otherwise, the erasure pointer is unset (block 660). It is then determined whether another synchronization mark has been identified (block 655). Where another synchronization mark has been identified (block 655), the process is re-synchronized (block 610) and the processing continues for the next symbols (blocks 615-660). Otherwise, where another synchronization mark is not identified (block 655), the counter is reset (block 615) and the processing continues for the next symbol (blocks 620-660).

In conclusion, the present invention provides novel systems, devices, methods and arrangements for generating erasure flags. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A system for generating error indications, the system comprising:

a soft output decoder, wherein the soft output decoder is operable to receive a data stream and to produce a series of soft outputs and corresponding bit decisions based on the data stream;

a reliability threshold register, wherein the reliability threshold register is operable to store a reliability threshold output;

a comparator, wherein the comparator is operable to compare the reliability threshold output with each of the respective soft outputs, and wherein the comparator is operable to provide a non-zero value each time one of the soft outputs exceeds the reliability threshold output; and an accumulator, wherein the accumulator sums the non-zero values.

2. The system of claim 1, wherein the comparator is a first comparator, wherein the accumulator provides an accumulator error output, and wherein the system further comprises:

an error threshold register, wherein the error threshold register provides an error threshold output; and a second comparator, wherein the second comparator compares the error threshold output with the accumulator error output, and wherein the second comparator indicates an error condition when the accumulator error output is greater than the error threshold output.

3. The system of claim 2, wherein the system further comprises:
    a latch, wherein the latch stores the indication of the error condition.

4. The system of claim 2, wherein an erasure pointer is asserted when the error condition is indicated.

5. The system of claim 2, wherein the erasure pointer is asserted when both the error condition is indicated and synchronized to a symbol that corresponds to the error condition.

6. The system of claim 3, wherein the series of reliability indicators are associated with bits of a series of symbols, and wherein the latch is updated after each of the series of symbols is identified.

7. The system of claim 6, wherein the system further comprises:
    a sync detector, and wherein the series of symbols are identified based on an output of the sync detector.

8. The system of claim 1, wherein the soft output decoder is a soft output viterbi algorithm detector.

9. The system of claim 1, wherein the series of soft outputs and corresponding bit decisions is a series of log likelihood ratios and corresponding bit decisions.

10. A method for generating erasure pointers, the method comprising:
    receiving a data stream at a soft output decoder, wherein the soft output decoder is operable to produce a series of soft outputs and corresponding bit decisions based on the data stream;
    comparing each of the series of soft outputs with a reliability threshold; and
    incrementing an error value each time one of the series of soft outputs exceeds the reliability threshold.

11. The method of claim 10, wherein the method further comprises:
    comparing the error value with an error threshold; and
    generating an error indication where the error value exceeds the error threshold.

12. The method of claim 11, wherein the method further comprises:
    setting the reliability threshold; and
    setting the error threshold.

13. The method of claim 11, wherein the method further comprises:
    storing the error indication.

14. The method of claim 11, wherein the series of reliability indicators are associated with bits of a series of symbols, and wherein the error indication is stored after each of the series of symbols is identified.

15. The method of claim 10, wherein the series of soft outputs and corresponding bit decisions is a series of log likelihood ratios and corresponding bit decisions.

16. The method of claim 10, wherein the method further comprises:
    asserting an erasure pointer based on the error indication and synchronized to a symbol that corresponds to the error condition.

* * * * *